United States Patent
Chou et al.

(10) Patent No.: US 9,196,740 B2
(45) Date of Patent: Nov. 24, 2015

(54) TFT STRUCTURE AND PIXEL STRUCTURE

(71) Applicant: Au Optronics Corporation, Hsinchu (TW)

(72) Inventors: Cheng-Wei Chou, Tainan (TW); Hsueh-Hsing Lu, Hsinchu County (TW); Hung-Che Ting, Taipei (TW); Tsung-Hsiang Shih, Yilan County (TW); Chia-Yu Chen, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 290 days.

(21) Appl. No.: 13/633,879

(22) Filed: Oct. 3, 2012

(65) Prior Publication Data
US 2013/0026472 A1    Jan. 31, 2013

Related U.S. Application Data

(63) Continuation of application No. 12/753,098, filed on Apr. 1, 2010, now abandoned.

(30) Foreign Application Priority Data

Feb. 10, 2010    (TW) ............................... 99104156 A

(51) Int. Cl.
*H01L 29/12* (2006.01)
*H01L 29/786* (2006.01)
*H01L 27/12* (2006.01)

(52) U.S. Cl.
CPC ........ *H01L 29/7869* (2013.01); *H01L 27/1225* (2013.01)

(58) Field of Classification Search
CPC .................. H01L 29/7869; H01L 27/1225
USPC ............................................ 257/257, 57, 43
See application file for complete search history.

(56) References Cited

U.S. PATENT DOCUMENTS

| 2004/0119141 A1* | 6/2004 | Schreiter ............ G01N 33/4833 257/532 |
| 2006/0233697 A1* | 10/2006 | Zhou ....................... B82Y 30/00 423/610 |
| 2008/0112880 A1* | 5/2008 | Kayama .................. B01J 35/004 423/610 |
| 2008/0213140 A1* | 9/2008 | Tabata et al. ............. 422/186.07 |
| 2009/0008667 A1* | 1/2009 | Fujii .................... H01L 51/0005 257/98 |
| 2010/0084651 A1* | 4/2010 | Yamazaki ........... H01L 27/1225 257/43 |

FOREIGN PATENT DOCUMENTS

TW    200425359    11/2004

OTHER PUBLICATIONS

"Office Action of Taiwan Counterpart Application", issued on Dec. 25, 2012, p. 1-p. 5.

* cited by examiner

*Primary Examiner* — Vongsavanh Sengdara
(74) *Attorney, Agent, or Firm* — Jianq Chyun IP Office

(57) ABSTRACT

A pixel structure including a substrate, a gate, an insulation layer, a metal oxide semiconductor (MOS) layer, a source and a drain, at least one film layer, and a first electrode layer is provided. The gate is disposed on the substrate. The insulation layer covers the gate. The MOS layer is disposed on the insulation layer above the gate. The source and the drain are disposed on the MOS layer. The film layer covers the MOS layer and includes a transparent photocatalytic material, wherein the transparent photocatalytic material blocks ultraviolet light from reaching the MOS layer. The first electrode layer is electrically connected to the source or the drain.

15 Claims, 7 Drawing Sheets

TFT STRUCTURE AND PIXEL STRUCTURE

CROSS-REFERENCE TO RELATED APPLICATION

This application is a continuation application of and claims the priority benefit of a prior application Ser. No. 12/753,098, filed on Apr. 1, 2010, now pending. The prior application Ser. No. 12/753,098 claims the priority benefit of Taiwan application serial no. 99104156, filed on Feb. 10, 2010. The entirety of each of the above-mentioned patent applications is hereby incorporated by reference herein and made a part of this specification.

BACKGROUND OF THE INVENTION

1. Field of the Invention

The present invention generally relates to a pixel structure, and more particularly, to a pixel structure, a method of fabricating the pixel structure, and a method of fabricating an electronic device having the pixel structure.

2. Description of Related Art

An electroluminescence apparatus is a self-emissive apparatus. The electroluminescence apparatus offers unlimited viewing angles, low fabricating cost, high response rate (over a hundred times of that of liquid crystal), low power consumption, adaptability to direct current (DC) driving of portable equipments, large operating temperature range, and light weight, and the size and thickness thereof can be reduced according to those of the corresponding hardware equipment. Accordingly, the electroluminescence apparatus is a very promising technique and is about to become one of the next-generation flat panel displays.

For example, an active electroluminescence apparatus includes a plurality of pixel structures, and each of the pixel structures includes an active device and a light emitting device electrically connected to the active device. The active device may be a thin film transistor (TFT), and which includes a gate, a source and a drain, and a semiconductor layer. The light emitting device is composed of an upper electrode layer, a lower electrode layer, and a light emitting layer disposed between the two electrode layers. The lower electrode layer of the light emitting device is electrically connected to the source or the drain of the active device so that the active device is served as a switch that controls the light emitting device.

During the fabrication of a pixel structure, after the lower electrode layer is formed on the active device, the surface of the lower electrode layer is usually cleaned to remove contaminant by using ultraviolet light and ozone. However, the device characteristics of the active device may be deteriorated when the ultraviolet light is irradiated on the semiconductor layer of the active device. As a result, the device characteristics of the pixel structure and the electroluminescence apparatus are also affected.

SUMMARY OF THE INVENTION

Accordingly, the present invention is directed to a pixel structure, wherein the pixel structure is prevented from deteriorating when it is irradiated by ultraviolet light.

The present invention is also directed to a method of fabricating a pixel structure, wherein the pixel structure is prevented from deteriorating when it is irradiated by ultraviolet light.

The present invention is further directed to a method of fabricating an electronic device, wherein the electronic device has good device characteristics.

The present invention provides a pixel structure including a substrate, a gate, an insulation layer, a metal oxide semiconductor (MOS) layer, a source and a drain, at least one film layer, and a first electrode layer. The gate is disposed on the substrate. The insulation layer covers the gate. The MOS layer is disposed on the insulation layer above the gate. The source and the drain are disposed on the MOS layer. The film layer covers the MOS layer. The film layer includes a transparent photocatalytic material, wherein the transparent photocatalytic material blocks an ultraviolet light from reaching the MOS layer. The first electrode layer is electrically connected to the source or the drain.

The present invention also provides a method of fabricating a pixel structure. First, a gate is formed on a substrate. Then, an insulation layer is formed on the gate. Next, a MOS layer is formed on the insulation layer above the gate. After that, a source and a drain are formed on the MOS layer. Next, at least one film layer is formed. The film layer covers the MOS layer and includes a transparent photocatalytic material, wherein the transparent photocatalytic material blocks an ultraviolet light from reaching the MOS layer. Thereafter, a first electrode layer is formed, wherein the first electrode layer is electrically connected to the source or the drain.

The present invention further provides a method of fabricating an electronic device. First, a plurality of pixel structures is formed on a substrate, wherein each of the pixel structures is fabricated through the method described above. Then, a sealant is formed on the surface of the substrate. Next, a cover is formed on the substrate, wherein the cover shelters the pixel structures and is in contact with the sealant. After that, an ultraviolet curing procedure is performed to cure the sealant.

As described above, in the present invention, a film layer including a transparent photocatalytic material is formed on a MOS layer so that the MOS layer is protected from the irradiation of ultraviolet light. Thereby, the pixel structure is prevented from deteriorating under the irradiation of the ultraviolet light, and accordingly the pixel structure and an electronic device having the same can have good device characteristics.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
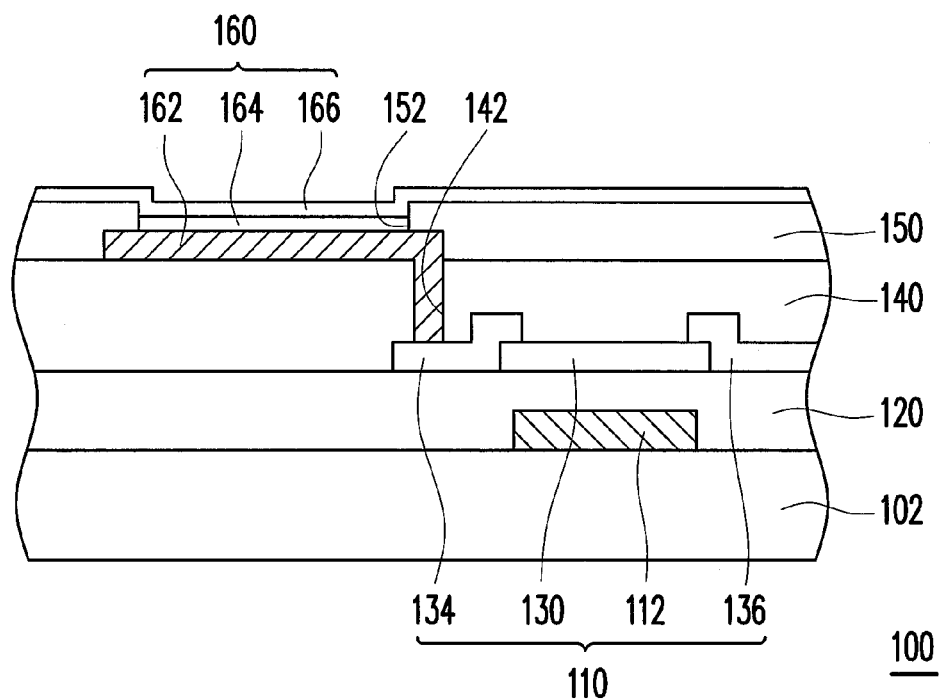
FIG. 1 is a cross-sectional diagram of a pixel structure according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a cross-sectional diagram of a pixel structure according to an embodiment of the present invention. Referring to FIG. 1, the pixel structure 100 includes a substrate 102, a gate 112, an insulation layer 120, a metal oxide semiconductor (MOS) layer 130, a source 134 and a drain 136, a first passivation layer 140, and a first electrode layer 162. The gate 112, the MOS layer 130, the source 134, and the drain 136 form an active device 110. To be specific, the gate 112 is disposed on the substrate 102. The insulation layer 120 covers the gate 112. The MOS layer 130 is disposed on the insulation layer 120 above the gate 112. The source 134 and the drain 136 are disposed on the MOS layer 130. The first passivation layer 140 is disposed on the source 134 and the drain 136 and covers the MOS layer 130. In the present embodiment, the MOS layer 130 may be made of indium-gallium-zinc oxide (IGZO), indium-zinc oxide (IZO), gallium-zinc oxide (GZO), zinc-tin oxide (ZTO), or zinc oxide (ZnO).

As shown in FIG. 1, in the present embodiment, the pixel structure 100 further includes a light-emitting material layer 164, a second electrode layer 166, and a second passivation layer 150. The first electrode layer 162, the light-emitting material layer 164, and the second electrode layer 166 form a light emitting device 160. To be specific, the first electrode layer 162 is disposed on the first passivation layer 140, and the first electrode layer 162 may be electrically connected to the source 134 through a contact window opening 142 in the first passivation layer 140. The second passivation layer 150 is disposed on the first passivation layer 140 and has an opening 152 for exposing the first electrode layer 162. The light-emitting material layer 164 may be disposed on the first electrode layer 162 exposed by the opening 152. The second electrode layer 166 covers the light-emitting material layer 164 and is extended onto the surface of the second passivation layer 150. It should be noted that in the present embodiment, the first electrode layer 162 is electrically connected to the source 134 through the contact window opening 142 in the first passivation layer 140. However, in other embodiments, the first electrode layer 162 may also be electrically connected to the drain 136 through a contact window opening (not shown) in the first passivation layer 140.

In the present embodiment, the first electrode layer 162 may be a metal electrode layer or a transparent conductive layer. The light-emitting material layer 164 may be an organic light emitting layer or an inorganic light emitting layer. For example, the light-emitting material layer 164 may be a red organic light emitting pattern, a green organic light emitting pattern, a blue organic light emitting pattern, or a light emitting pattern of other color (for example, white, orange, and purple, etc) produced by mixing lights of various wavelengths. The second electrode layer 166 may be a metal electrode layer or a transparent conductive layer.

It should be noted that in the present embodiment, at least one of the first passivation layer 140 and the second passivation layer 150 includes a transparent photocatalytic material, wherein the transparent photocatalytic material blocks an ultraviolet light with a wavelength of about 170 to about 350 nm from reaching the MOS layer 130. The transparent photocatalytic material includes insulating metal oxide or metal oxide nanoparticles, wherein the insulating metal oxide may be $TiO_x$, $TiSiO_x$, $ZnO_x$, $SnO_x$, $ZrO_x$, CdS, or ZnS, and the metal oxide nanoparticles may be $TiO_x$ nanoparticles, $TiSiO_x$ nanoparticles, $ZnO_x$ nanoparticles, $SnO_x$ nanoparticles, $ZrO_x$ nanoparticles, CdS nanoparticles, or ZnS nanoparticles. Namely, the film layer containing the transparent photocatalytic material may be insulating metal oxide or an insulating material containing metal oxide nanoparticles.

Figure 2:
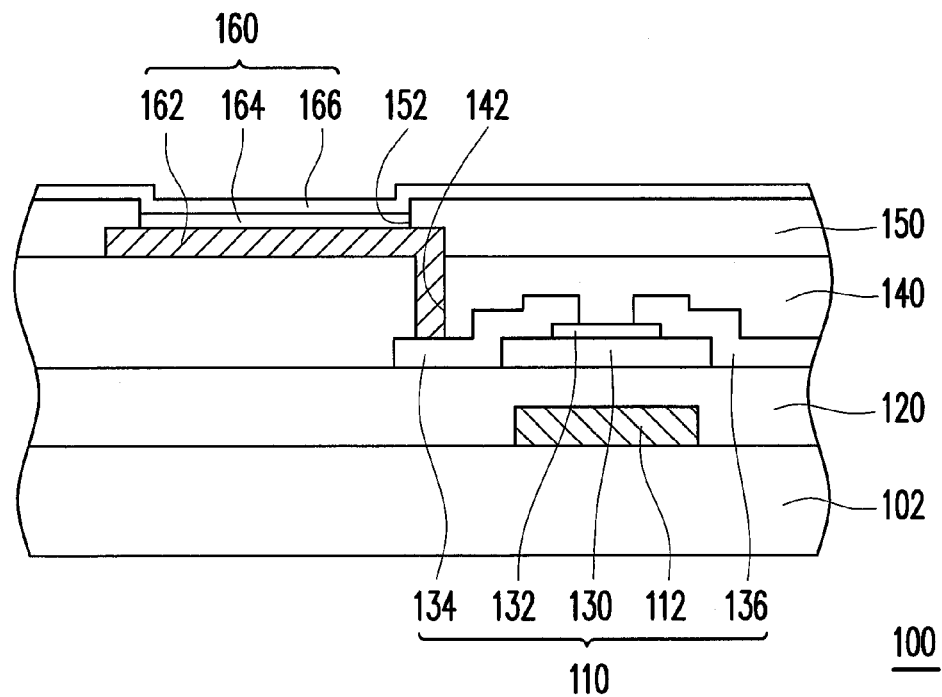
FIG. 2 is a cross-sectional diagram of a pixel structure according to another embodiment of the present invention.

In the present embodiment, at least one of the first passivation layer 140 and the second passivation layer 150 includes the transparent photocatalytic material. However, the pixel structure 100 may have another film layer that includes the transparent photocatalytic material. For example, as shown in FIG. 2, according to another embodiment of the present invention, the pixel structure 100 further includes an etch stop layer 132. The etch stop layer 132 is disposed on the surface of the MOS layer 130, and the first passivation layer 140 covers the source 134 and the drain 136 and the etch stop layer 132. In the embodiment illustrated in FIG. 2, at least one of the etch stop layer 132, the first passivation layer 140, and the second passivation layer 150 includes the transparent photocatalytic material. Moreover, in other embodiments, the film layer including the transparent photocatalytic material may also be other insulating film layer that covers the MOS layer 130. Furthermore, even though a pixel structure 100 having the light-emitting material layer 164 is described as an example in foregoing embodiments, in other embodiments, the pixel structure may also come without the light-emitting material layer and be applied in a device requiring no light-emitting material layer, such as a device in the active array substrate of a liquid crystal display (LCD).

In the embodiment described above, deterioration of device characteristics (for example, increase of an off current and shifting of a threshold voltage, etc) when ultraviolet light is irradiated on the MOS layer is prevented by forming a film layer including a transparent photocatalytic material on the MOS layer. Accordingly, the pixel structure can have good device characteristics.

Figure 3:
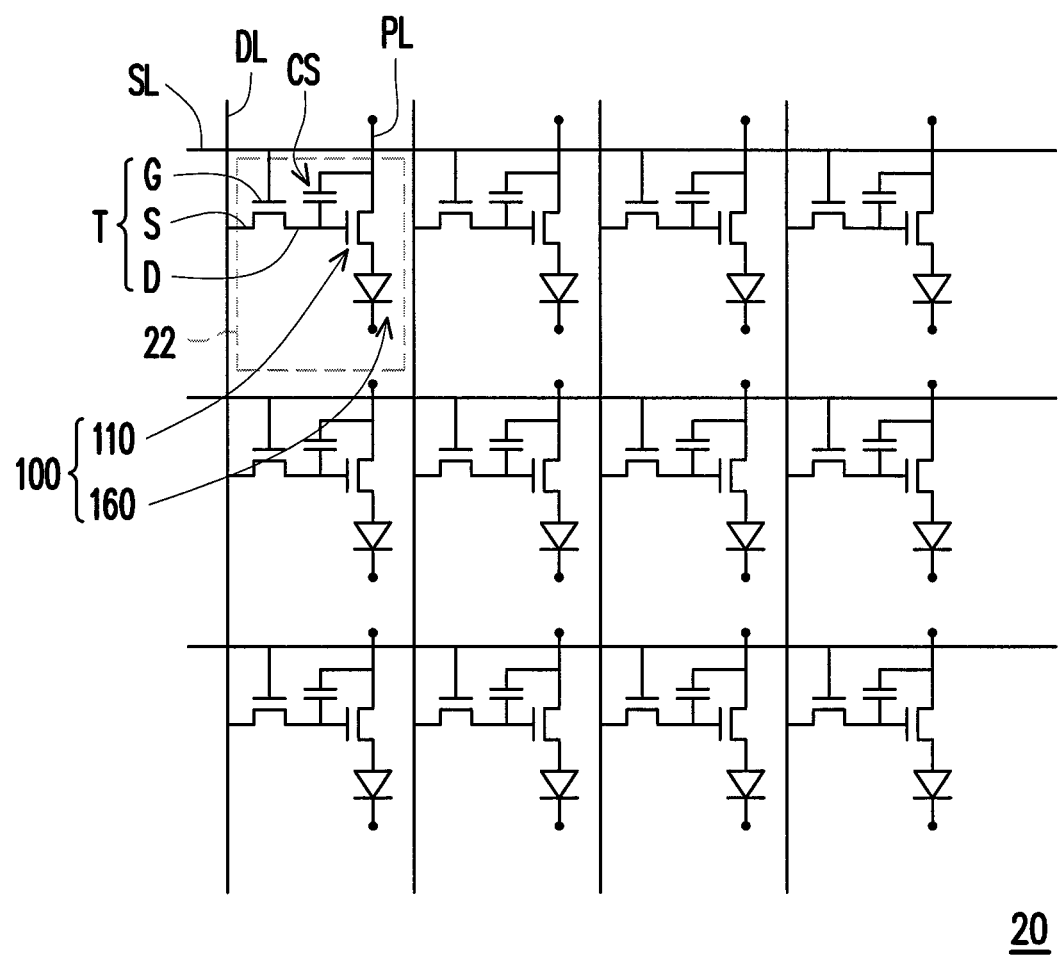
FIG. 3 is an equivalent circuit diagram of a pixel array according to an embodiment of the present invention.

It should be mentioned that substantially the pixel structure 100 illustrated in FIG. 1 and FIG. 2 can be further integrated with an active device and a capacitor to form a pixel unit, and a plurality of the pixel units can form a pixel array. FIG. 3 is an equivalent circuit diagram of a pixel array according to an embodiment of the present invention.

Referring to FIG. 3, the pixel array 20 is disposed on the substrate 102. The pixel array 20 includes a plurality of pixel units 22. Each of the pixel units 22 includes the pixel structure 100 as shown in FIG. 1 or FIG. 2, an active device T, and a capacitor CS. According to an embodiment of the present invention, the pixel array 20 further includes a plurality of scan lines SL, a plurality of data lines DL, and a plurality of power lines PL. Each of the pixel units 22 is electrically connected to the corresponding scan line SL, the corresponding data line DL, and the corresponding power line PL. To be specific, in the present embodiment, each pixel unit 22 includes the active devices 110 and T, the light emitting device 160, and the capacitor CS. The active device 110 includes a gate 112, a MOS layer 130, a source 134, and a drain 136 (referring to FIG. 1 and FIG. 2). The light emitting device 160 includes a first electrode layer 162, a light-emitting material layer 164, and a second electrode layer 166 (referring to FIG. 1 and FIG. 2). The active device T and the capacitor CS have the structures well known to those having ordinary knowledge in the art therefore will not be described herein. Additionally, in the present embodiment, each pixel unit 22 has two active devices and one capacitor (2T1C). However, the present invention is not limited thereto, and the numbers of active devices and capacitors in each pixel unit 22 are not limited in the present invention.

In the present embodiment, in each pixel unit 22 having the 2T1C structure, the source S of the active device T is connected to a data line DL, the gate G thereof is electrically connected to a scan line SL, and the drain D thereof is connected to the gate 112 of the active device 110. The gate 112 of the active device 110 is electrically connected to the drain D of the active device T, the source 134 thereof is electrically connected to a power line PL, and the drain 136 thereof is electrically connected to the light emitting device 160. One end of the capacitor CS is electrically connected to the drain D of the active device T and the gate of the active device 110, and the other end of the capacitor CS is electrically connected to the source 134 of the active device 110 and a power line PL.

Figure 4:
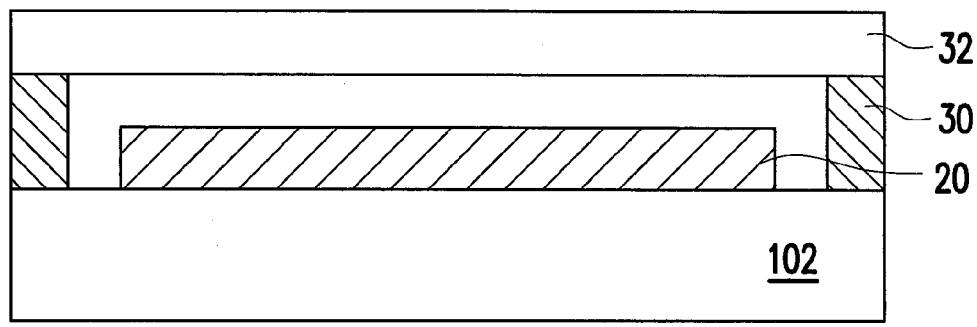
FIG. 4 is a diagram of an electronic device according to an embodiment of the present invention.
Figure 5:
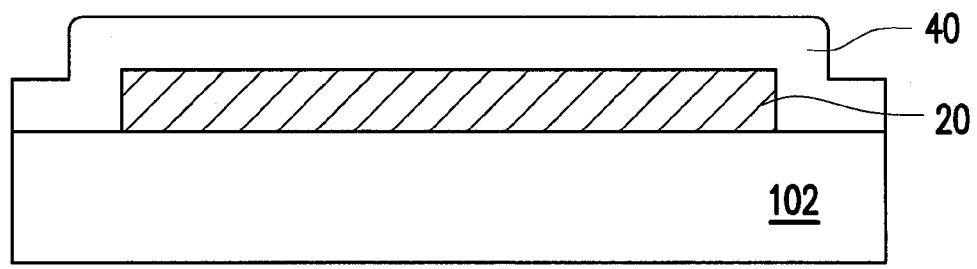
FIG. 5 is a diagram of an electronic device according to another embodiment of the present invention.

Generally speaking, a sealing procedure is performed to form an electronic device after the pixel array 20 is fabricated on the substrate 102. FIG. 4 is a diagram of an electronic device according to an embodiment of the present invention. Referring to FIG. 4, the electronic device 10 includes a pixel array 20 including a plurality of the pixel structure 100 illustrated in FIG. 1 and FIG. 2, a sealant 30, and a cover 32. In the electronic device 10 of the present embodiment, the sealant 30 may be an ultraviolet curing adhesive, and the cover 32 may be a glass cover, a plastic cover, or a cover in other transparent material. In the present embodiment, since the pixel structure 100 has the light-emitting material layer 164, the electronic device 10 having the pixel structure 100 may be an electroluminescence apparatus. However, as described above, the pixel structure in the present invention may also come without the light-emitting material layer, so that the pixel structure may also be applied to other types of electronic devices. Additionally, in another embodiment, as shown in FIG. 5, a passivation film 40 may also be formed on the pixel array 20 illustrated in FIG. 3, so as to form an electronic device 10a.

In the embodiment described above, deterioration of device characteristics (for example, increase of an off current and shifting of a threshold voltage, etc) when ultraviolet light is irradiated on the MOS layer is prevented by forming a film layer including a transparent photocatalytic material on the MOS layer. Accordingly, the pixel structure, a pixel array having such pixel structures, and an electronic device having such pixel structures can all have good device characteristics.

The method of fabricating the pixel structure in the present invention will be described herein. The method of fabricating the pixel structure in FIG. 1 is similar to that of fabricating the pixel structure in FIG. 2, and the major difference between the two methods is that no etch stop layer is formed in the method of fabricating the pixel structure in FIG. 1. Below, the method of fabricating the pixel structure in FIG. 2 will be described as an example, and the method of fabricating the pixel structure in FIG. 1 will not be described.

Figure 6A:
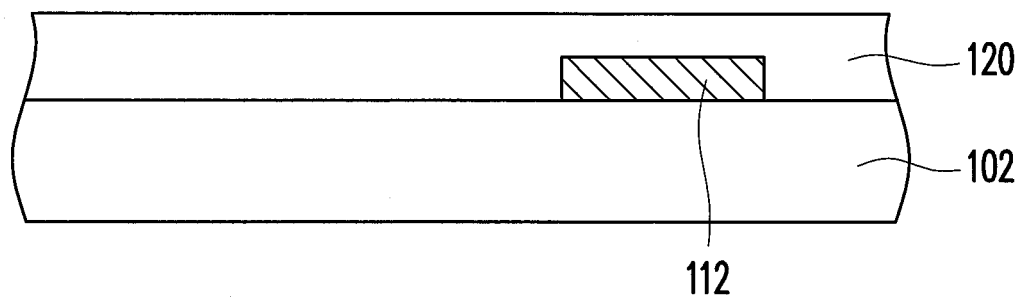
FIGS. 6A-6F are cross-sectional diagrams illustrating a method of fabricating the pixel structure in FIG. 2.

FIGS. 6A-6E are cross-sectional diagrams illustrating a method of fabricating the pixel structure in FIG. 2. Referring to FIG. 6A, first, a gate 112 is formed on a substrate 102. Then, an insulation layer 120 is formed on the gate 112. The substrate 102 may be a rigid substrate (for example, a glass substrate) or a flexible substrate (for example, a plastic substrate). The gate 112 may be made of a metal material and formed by physical vapor deposition (PVD). Next, an insulation layer 120 is formed on the gate 112. The insulation layer 120 may be made of silicon nitride or silicon oxide.

Figure 6B:
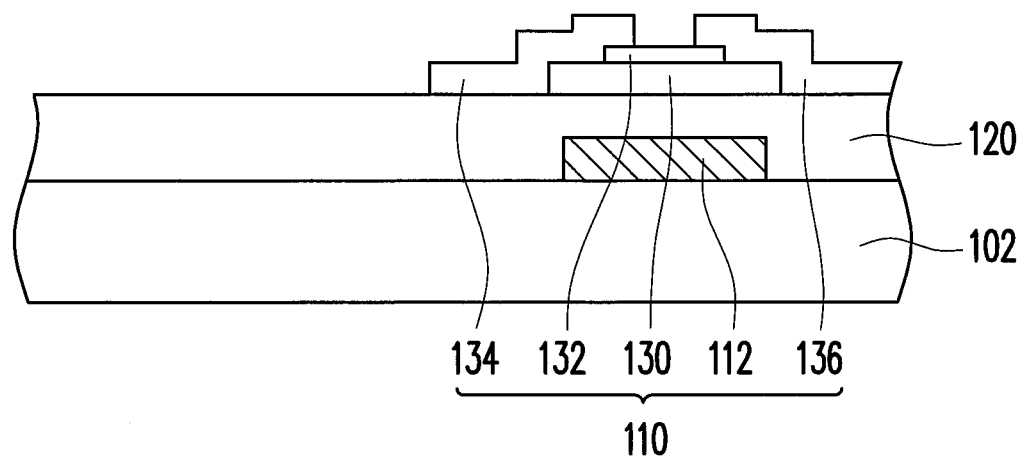

Referring to FIG. 6B, next, a MOS layer 130 is formed on the insulation layer 120 above the gate 112. The MOS layer 130 may be made of IGZO. After that, an etch stop layer 132 is formed on the MOS layer 130. Then, a source 134 and a drain 136 are formed on the MOS layer 130. The source 134 and the drain 136 may be made of a metal material and formed by PVD.

Figure 6C:
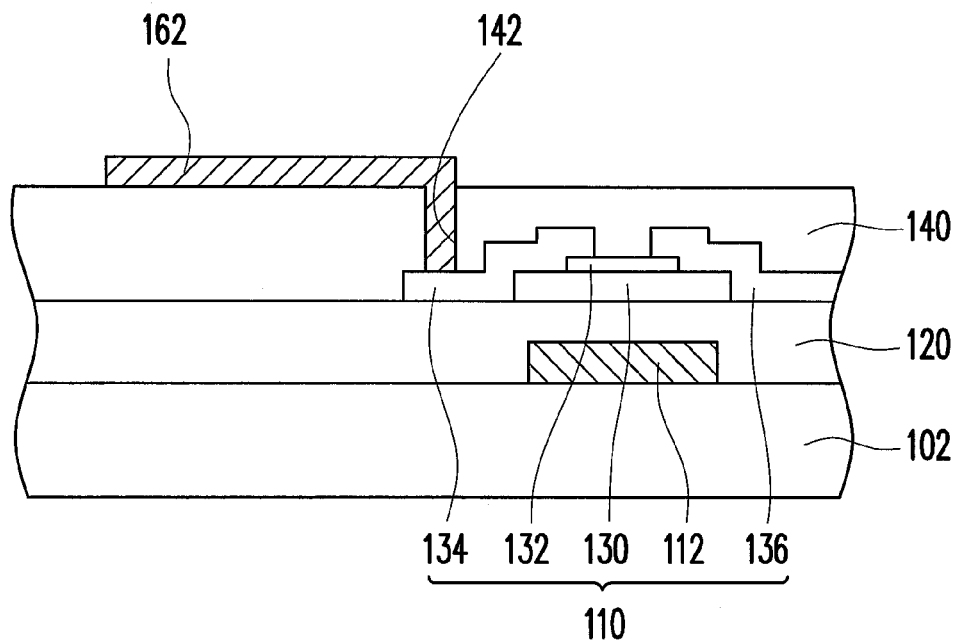

Referring to FIG. 6C, thereafter, a first passivation material layer (not shown) is formed on the source 134 and the drain 136, and the MOS layer 130 is covered. Next, the first passivation material layer is patterned to form a first passivation layer 140 having a contact window opening 142, wherein the contact window opening 142 may expose the source 134. After that, a first electrode layer 162 is formed, and the first electrode layer 162 is filled in the contact window opening 142 to be electrically connected with the source 134. The first electrode layer 162 may be a metal electrode layer or a transparent conductive layer.

Figure 6D:
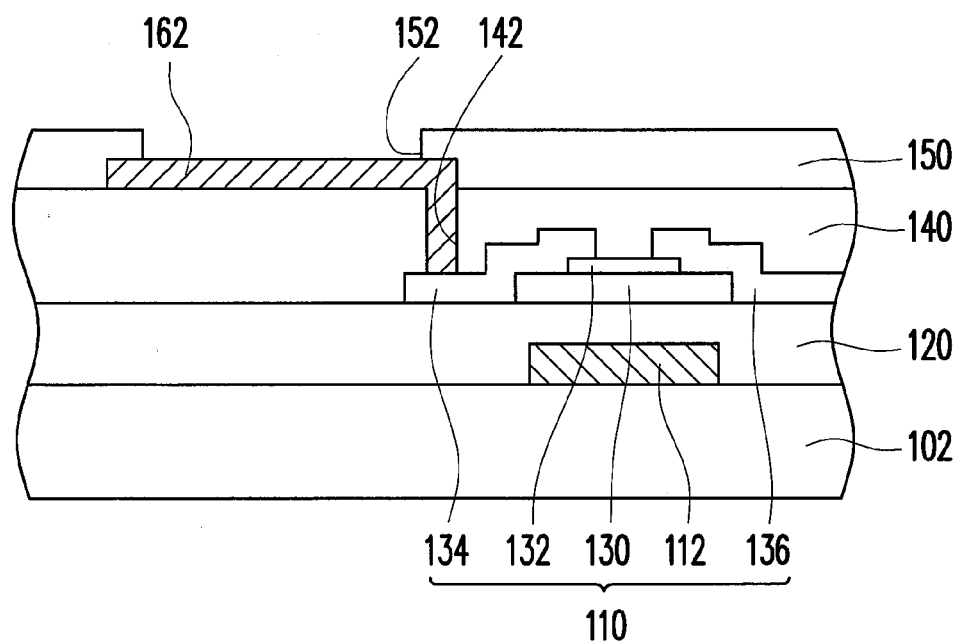

Referring to FIG. 6D, next, a second passivation material layer (not shown) is formed on the first passivation layer 140, and the first electrode layer 162 is covered. After that, the second passivation material layer is patterned to form a second passivation layer 150 having an opening 152, wherein the opening 152 exposes the first electrode layer 162.

In the present embodiment, at least one of the etch stop layer 132, the first passivation layer 140, and the second passivation layer 150 includes a transparent photocatalytic material, wherein the transparent photocatalytic material blocks an ultraviolet light with a wavelength of about 170 to about 350 nm from reaching the MOS layer 130. The transparent photocatalytic material includes insulating metal oxide or metal oxide nanoparticles, wherein the insulating metal oxide may be TiOx, TiSiOx, ZnOx, SnOx, ZrOx, CdS, or ZnS, and the metal oxide nanoparticles may be TiOx nanoparticles, TiSiOx nanoparticles, ZnOx nanoparticles, SnOx nanoparticles, ZrOx nanoparticles, CdS nanoparticles, or ZnS nanoparticles. Namely, a film layer including the transparent photocatalytic material may be insulating metal oxide or an insulating material containing metal oxide nanoparticles.

Figure 6E:
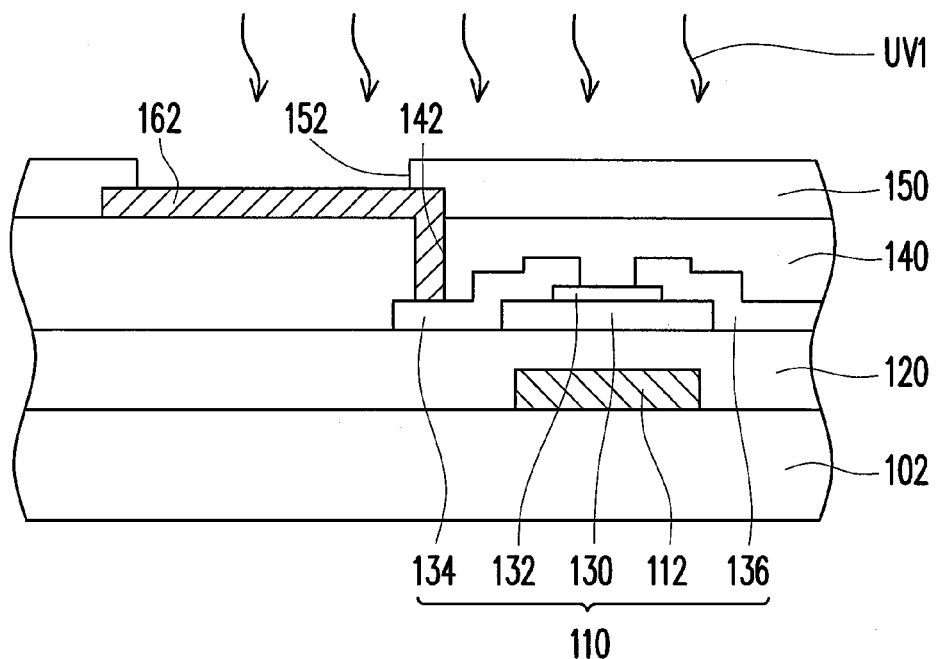

Referring to FIG. 6E, thereafter, an ultraviolet cleaning procedure UV1 is performed on the surface of the first electrode layer 162 to remove contaminant on the surface. In the present embodiment, the ultraviolet cleaning procedure UV1 includes supplying ozone and irradiating with an ultraviolet light, wherein the wavelength of the ultraviolet light is about 172 nm. However, the wavelength of the ultraviolet light is not limited thereto, and which can be changed by a designer according to the actual requirement. It should be noted that because at least one of the etch stop layer 132, the first passivation layer 140, and the second passivation layer 150 includes a transparent photocatalytic material, the ultraviolet light used during the ultraviolet cleaning procedure UV1 is prevented from irradiating the MOS layer 130.

Figure 6F:
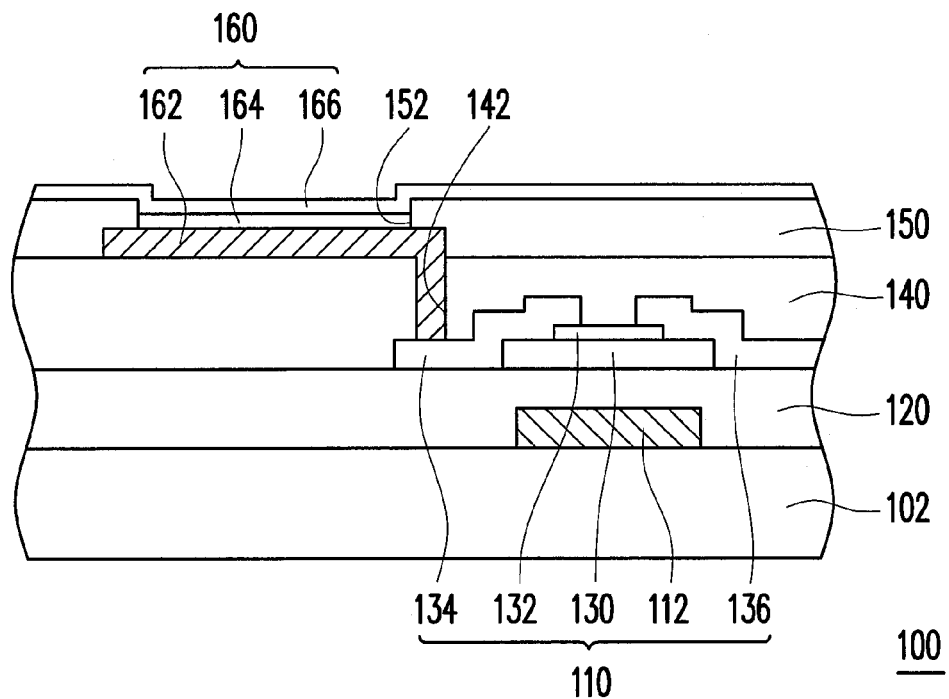

Referring to FIG. 6F, a light-emitting material layer 164 is formed on the first electrode layer 162 and a second electrode layer 166 is formed on the light-emitting material layer 164. By now, the fabrication of the pixel structure 100 is completed. The light-emitting material layer 164 may be an organic light emitting layer or an inorganic light emitting layer, and which may be filled in the opening 152 of the second passivation layer 150. The second electrode layer 166 may be a metal electrode layer or a transparent conductive layer. The second electrode layer 166 covers the light-emitting material layer 164 and is extended onto the surface of the second passivation layer 150.

Generally speaking, a sealing procedure is further performed to complete the fabrication of the electronic device after a plurality of pixel structures 100 is formed on the substrate 102 through the process described above. Below, the process of fabricating the electronic device will be described with reference to FIGS. 7A-7C.

Figure 7A:
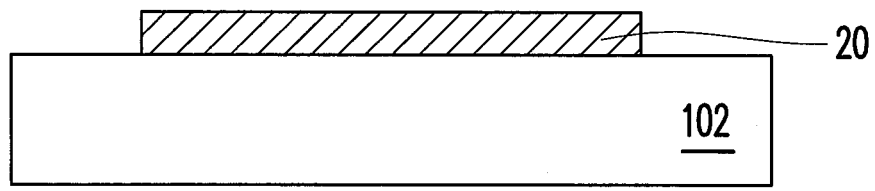
FIGS. 7A-7C are cross-sectional diagrams illustrating a method of fabricating an electronic device.
Figure 7B:
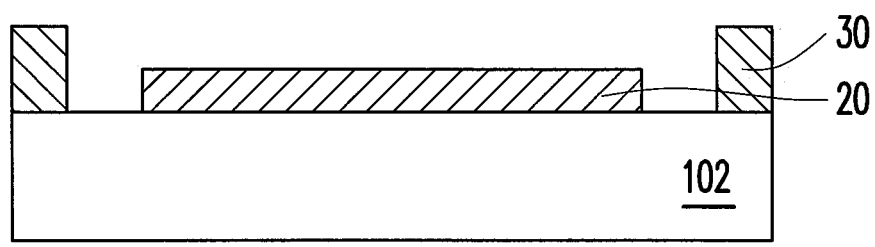
Figure 7C:
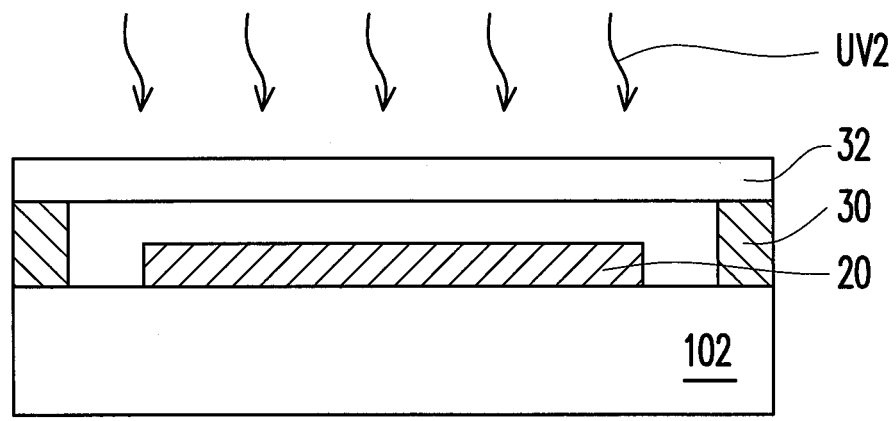

FIGS. 7A-7C are cross-sectional diagrams illustrating a method of fabricating an electronic device. Referring to FIG. 7A, first, a plurality of pixel structures 100 is formed on a substrate 102 through the process illustrated in FIGS. 6A-6F, so as to form a pixel array 20. As illustrated in FIG. 3 and described above, the pixel array 20 includes a plurality of pixel structures 100 and capacitors CS, active devices T, data lines DL, scan lines SL, and power lines PL. Since the techniques of fabricating the capacitors CS, the active devices T, the data lines DL, the scan lines SL, and the power lines PL are well known to those having ordinary knowledge in the art therefore will not be described herein.

Referring to FIG. 7B, then, a sealant 30 is formed on the surface of the substrate 102. In the present embodiment, the sealant 30 may be an ultraviolet curing adhesive.

Referring to FIG. 7C, next, a cover 32 is formed on the substrate 102, wherein the cover 32 shelters the pixel structures (i.e., the pixel array 20) and is in contact with the sealant 30. The cover 32 may be a glass cover, a plastic cover, or a cover of other transparent material.

Thereafter, an ultraviolet curing procedure UV2 is performed to cure the sealant 30, so as to form the electronic device 10. In the present embodiment, the ultraviolet light used in the ultraviolet curing procedure UV2 has a wavelength of about 313 nm. However, the wavelength of the ultraviolet light is not limited thereto, and which can be changed by a designer according to the actual requirement. It should be noted that because at least one of the etch stop layer 132, the first passivation layer 140, and the second passivation layer 150 in the pixel structure 100 includes a transparent photocatalytic material, the ultraviolet light used during the ultraviolet curing procedure UV2 is prevented from irradiating the MOS layer 130.

In the present embodiment, the ultraviolet light used in the ultraviolet cleaning procedure, the ultraviolet curing procedure, or other procedures is prevented from irradiating the MOS layer by forming a film layer including a transparent photocatalytic material on the MOS layer. Accordingly, deterioration of device characteristics (for example, increase of an off current and shifting of a threshold voltage, etc) caused by the irradiation of the ultraviolet light on the MOS layer is prevented. Thus, the pixel structure and the electronic device having such pixel structures can have good device characteristics.

As described above, in the present invention, a film layer including a transparent photocatalytic material is formed on a MOS layer so that the MOS layer is protected from the irradiation of ultraviolet light. Thereby, the pixel structure is prevented from deteriorating under the irradiation of the ultraviolet light, and accordingly the pixel structure and an electronic device having the same can have good device characteristics.

In addition, in the present invention, ultraviolet light is blocked and accordingly the MOS layer is protected by changing the material of a film layer, such as an etch stop layer or a passivation layer. Namely, according to the present invention, no additional structure is to be formed in the pixel structure. Thus, the pixel structure in the present invention can be applied to an existing pixel structure layout and can be fabricated by using existing pixel structure fabricating process and machine. Thereby, the fabricating cost of the pixel structure in the present invention is not increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure, comprising:
a substrate;
a gate, disposed on the substrate;
a metal oxide semiconductor (MOS) layer, disposed on the substrate;
an insulation layer, disposed between the gate and the MOS layer;
a source and a drain, disposed on the MOS layer;
a first passivation layer substantially covering the MOS layer, the source and the drain, wherein the first passivation layer is adapted to block an ultraviolet light;
a first electrode layer, electrically connected to the source or the drain through a contact window opening formed in the first passivation layer;
a second passivation layer formed on the first passivation layer and the first electrode layer, wherein the second passivation layer has an opening to expose the first electrode layer;
a light-emitting material layer disposed on the first electrode layer and completely located within the opening of the second passivation layer; and
a second electrode layer formed on the light-emitting material layer and the second passivation layer, wherein a portion of the second electrode layer is completely located within the opening of the second passivation layer;
wherein at least one of the first passivation layer and the second passivation layer comprises a photocatalytic material.

2. The pixel structure according to claim 1, wherein the first passivation layer comprises the photocatalytic material.

3. The pixel structure according to claim 1, wherein the second passivation layer comprises the photocatalytic material.

4. The pixel structure according to claim 1, further comprising:
an etch stop layer, disposed on a surface of the MOS layer; wherein the etch stop layer comprises the photocatalytic material.

5. The pixel structure according to claim 1, wherein the photocatalytic material comprises insulating metal oxide or metal oxide nanoparticles.

6. The pixel structure according to claim 5, wherein the insulating metal oxide comprises one or a combination of TiOx, TiSiOx, ZnOx, SnOx, ZrOx, CdS, and ZnS.

7. The pixel structure according to claim 5, wherein the metal oxide nanoparticles comprises one or a combination of TiOx nanoparticles, TiSiOx nanoparticles, ZnOx nanoparticles, SnOx nanoparticles, ZrOx nanoparticles, CdS nanoparticles, and ZnS nanoparticles.

8. The pixel structure according to claim 1, wherein the photocatalytic material blocks light with a wavelength of about 170 to about 350 nm.

9. The pixel structure according to claim 1, wherein the photocatalytic material comprises TiOx.

10. The pixel structure according to claim 1, wherein the photocatalytic material comprises TiSiOx.

11. The pixel structure according to claim 1, wherein the photocatalytic material comprises ZNOx.

12. The TFT structure according to claim 1, wherein the photocatalytic material comprises SnOx.

13. The TFT structure according to claim 1, wherein the photocatalytic material comprises ZrOx.

14. The TFT structure according to claim 1, wherein the photocatalytic material comprises CdS.

15. The TFT structure according to claim 1, wherein the photocatalytic material comprises ZnS.

* * * * *